US012647112B2

(12) United States Patent
Watanabe

(10) Patent No.: US 12,647,112 B2
(45) Date of Patent: Jun. 2, 2026

(54) SWITCH DRIVE DEVICE

(71) Applicant: DENSO CORPORATION, Kariya-city (JP)

(72) Inventor: Yosuke Watanabe, Kariya-city (JP)

(73) Assignee: DENSO CORPORATION, Kariya (JP)

( * ) Notice: Subject to any disclaimer, the term of this patent is extended or adjusted under 35 U.S.C. 154(b) by 4 days.

(21) Appl. No.: 18/648,928

(22) Filed: Apr. 29, 2024

(65) Prior Publication Data

US 2024/0283446 A1 Aug. 22, 2024

Related U.S. Application Data

(63) Continuation of application No. PCT/JP2022/037174, filed on Oct. 4, 2022.

(30) Foreign Application Priority Data

Oct. 29, 2021 (JP) ................................. 2021-177912

(51) Int. Cl.
  *H03K 17/30* (2006.01)
  *H03K 17/06* (2006.01)
(52) U.S. Cl.
  CPC ............. *H03K 17/30* (2013.01); *H03K 17/06* (2013.01); *H03K 2217/0063* (2013.01); *H03K 2217/0072* (2013.01)
(58) Field of Classification Search
  CPC ................... H03K 17/30; H03K 17/06; H03K 2217/0063; H03K 2217/0072; H03K 2017/0806; H03K 17/16; H03K 17/302; H03K 2217/00; H02M 1/00; H02M 1/08; H02M 7/537
See application file for complete search history.

(56) References Cited

U.S. PATENT DOCUMENTS 5,291,071 A * 3/1994 Allen ................. H03K 19/1731
327/108

FOREIGN PATENT DOCUMENTS

JP 2000-323977 A 11/2000
JP 2020-096444 A 6/2020

* cited by examiner

*Primary Examiner* — Jung Kim
(74) *Attorney, Agent, or Firm* — Oliff PLC

(57) ABSTRACT

A switch driving device for driving an upper arm switch, which is a switch on an upper arm, and a lower arm switch, which is a switch on a lower arm, where the upper arm and lower arm switches are electrically connected in series with each other. In the switch driving device, a determiner is configured to determine, for each of the upper arm and lower arm switches, whether the switch is on or off, and a driver is configured to, in response to the determiner determining that one of the upper arm and lower arm switches is off, turn on the other of the upper arm and lower arm switches. The determiner is further configured to variably set determination parameters for determining whether a respective one of the upper arm and lower arm switches is on or off, according to characteristics of the upper arm and lower arm switches.

4 Claims, 9 Drawing Sheets

TEMPERATURE

START

S10

Sg1a = L (Sg1b = L)

S11

ACQUIRE DETERMINATION TEMPERATURES
AND GATE VOLTAGES Vge1, Vge2

S12

SET DETERMINATION VOLTAGES Vj1, Vj2

S13

Vge1 < Vj1 ? (Vge2 < Vj2 ?)  NO

YES

S14

Sg1b = H (Sg1a = H)

END

Vth

Vj

VthH

VthL

TEMPERATURE

SWITCH DRIVE DEVICE

CROSS-REFERENCE TO RELATED APPLICATION

This application is a continuation application of International Application No. PCT/JP2022/037174 filed Oct. 4, 2022 which designated the U.S. and claims priority to Japanese Patent Application No. 2021-177912 filed Oct. 29, 2021, the contents of each of which are incorporated herein by reference.

BACKGROUND

Technical Field

This disclosure relates to a switch driving device.

Related Art

Conventionally, a switch driving device is known for driving switches on upper and lower arms, connected in series with each other. This switch driving device determines, for each of the switches on the upper and lower arms, whether it is on or off, and when determining that one of the switches on the upper and lower arms is off, turns on the other switch.

DESCRIPTION OF SPECIFIC EMBODIMENTS

Figure 1:
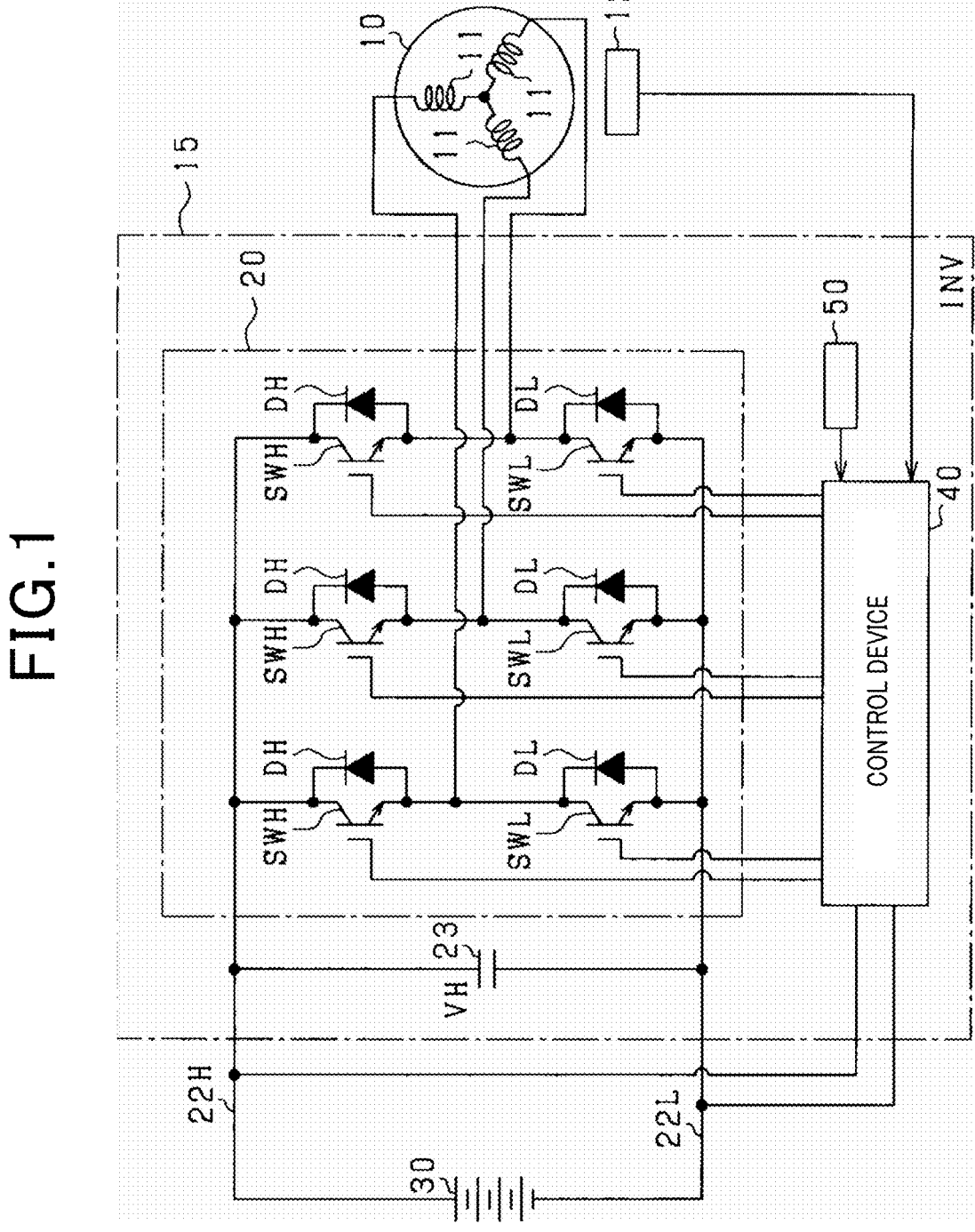
FIG. 1 is a schematic diagram of the overall configuration of a control system according to a first embodiment.

In the above known switch driving device, as disclosed in JP 2020-96444 A, a threshold voltage may vary depending on characteristics of the switches. This causes on/off switching timings of the switches to change. Thus, the timing at which a switch is determined to be off may deviate significantly from the timing at which the switch actually switches from on to off.

For example, if the timing at which a switch is determined to be off is later than the timing at which the switch actually switches from on to off, a dead time, which is a time period during which both the switches on the upper and lower arms are off, may increase. As a result, there is concern that losses caused by switching of the switches may increase.

In view of the foregoing, it is desired to have a switch driving device capable of reducing losses caused by switching of the switches.

One aspect of the present disclosure provides a switch driving device for driving an upper arm switch, which is a switch on an upper arm, and a lower arm switch, which is a switch on a lower arm, where the upper arm and lower arm switches are electrically connected in series with each other. In the switch driving device, a determiner is configured to determine, for each of the upper arm and lower arm switches, whether the switch is on or off, and a driver is configured to, in response to the determiner determining that one of the upper arm and lower arm switches is off, turn on the other of the upper arm and lower arm switches. The determiner is further configured to variably set determination parameters for determining whether a respective one of the upper arm and lower arm switches is on or off, according to characteristics of the upper arm and lower arm switches.

According to the present disclosure, even if the threshold voltage varies depending on the characteristics of the upper arm and lower arm switches, the determination parameters for determining whether a respective one of the upper arm and lower arm switches is on or off, are variably set according to characteristics of the upper arm and lower arm switches. This can prevent the timing at which a respective one of the upper arm and lower arm switches is determined to be off from being delayed from the timing at which a respective one of the upper arm and lower arm switches is actually turned off. Therefore, the dead time can be reduced, and the losses caused by switching of the upper arm and lower arm switches can be reduced.

With reference to the accompanying drawings, hereinafter are described several embodiments of the present disclosure. Substantially common elements throughout the embodiments are assigned the same numbers and will not be redundantly described.

First Embodiment

A switch driving device according to a first embodiment of the present disclosure will now be described. The switch driving device according to the present embodiment is applied to a 3-phase inverter as a power converter. In the present embodiment, a control system equipped with the inverter is to be mounted to a vehicle such as an electric vehicle or a hybrid vehicle.

As illustrated in FIG. 1, the control system includes a rotating electric machine 10 and the inverter 15. The rotating electric machine 10 is an on-board prime mover with a rotor capable of transmitting power to drive wheels (not shown). In the present embodiment, a synchronous machine, more specifically, a permanent magnet synchronous machine, may be used as the rotating electric machine 10.

The inverter 15 includes a switching device section 20. The switching device section 20 includes a series connection of an upper arm switch SWH and a lower arm switch SWL for each of three phases. For each phase, a first end of a phase winding 11 of the rotating electric machine 10 is connected to a connection point of the upper arm and lower arm switches SWH, SWL. Second ends of the respective phase windings 11 are connected at a neutral point. The phase windings 11 are 120 degrees in electrical angle out of phase from each other. In the present embodiment, a voltage-controlled semiconductor switching element, more specifically, an IGBT, may be used as a respective one of the switches SWH, SWL. IGBT is an abbreviation for Insulated-Gate Bipolar Transistor. Each upper arm switch SWH is connected in anti-parallel with an upper arm diode DH, and each lower arm switch SWL is connected in anti-parallel with a lower arm diode DL. The upper arm and lower arm diodes DH, DL are freewheeling diodes.

The collector of each upper arm switch SWH, which is a high-side terminal of the upper arm switch SWH, is connected to the positive terminal of the DC power source 30 via a high-side electrical path 22H. The emitter of each lower arm switch SWL, which is a low-side terminal of the lower arm switch SWL, is connected to the negative terminal of the DC power source 30 via a low-side electrical path 22L. In the present embodiment, the DC power source 30 is a secondary battery with its output voltage (rated voltage) of, for example, one hundred V or more.

The inverter 15 includes a capacitor 23. The capacitor 23 electrically connects the high-side electrical path 22H and the low-side electrical path 22L.

The inverter 15 includes a control device 40 and an inverter temperature sensor 50. The inverter temperature sensor 50 may be, for example, a thermistor, and detects a temperature of the inverter 15. The inverter temperature may be, for example, a temperature of a coolant that cools the inverter 15, a temperature of a circuit board on which the inverter 15 is formed, or a temperature of the capacitor 23. A detection value of the inverter temperature sensor 50 is input to the control device 40.

The control system includes a motor temperature sensor 12. The motor temperature sensor 12 may be, for example, a thermistor, and detects a temperature of the rotating electric machine 10. The temperature of the rotating electric machine 10 may be, for example, a temperature of each phase winding 11. A detection value of the motor temperature sensor 12 is input to the control device 40.

Figure 2:
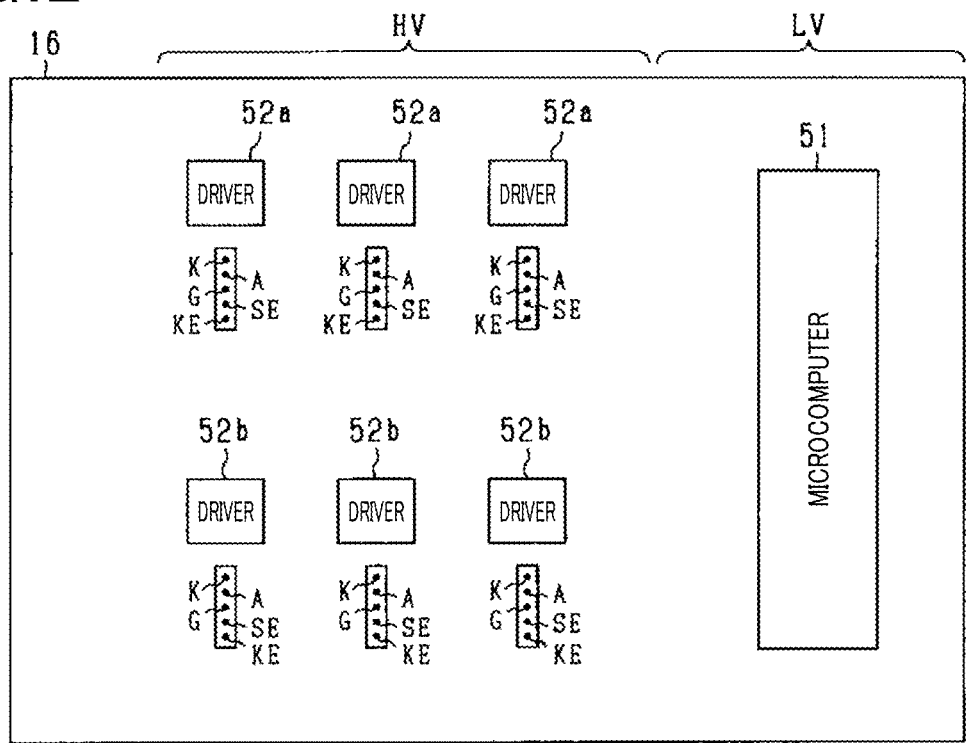
FIG. 2 is a schematic diagram illustrating a circuit board on which an inverter device is formed.

FIG. 2 illustrates the circuit board 16 on which the inverter 15 is formed. The circuit board 16 includes both a high-voltage region HV, which is electrically connected to the inverter 15, and a low-voltage region LV, which is electrically insulated from the high-voltage region HV. On a first surface of the circuit board 16, the switches SWH, SWL and the drivers 52a, 52b for the switches SWH, SWL are provided in the high-voltage region HV. A microcomputer 51 is provided in the low-voltage region LV. Signals are transferred between the driver 52 for each of the switches SWH, SWL and the microcomputer 51 via an insulating element provided between the high-voltage region HV and the low-voltage region LV. In the present embodiment, each insulating element is a magnetic coupler or a photocoupler. In FIG. 2, the insulating elements are not shown.

Figure 3:
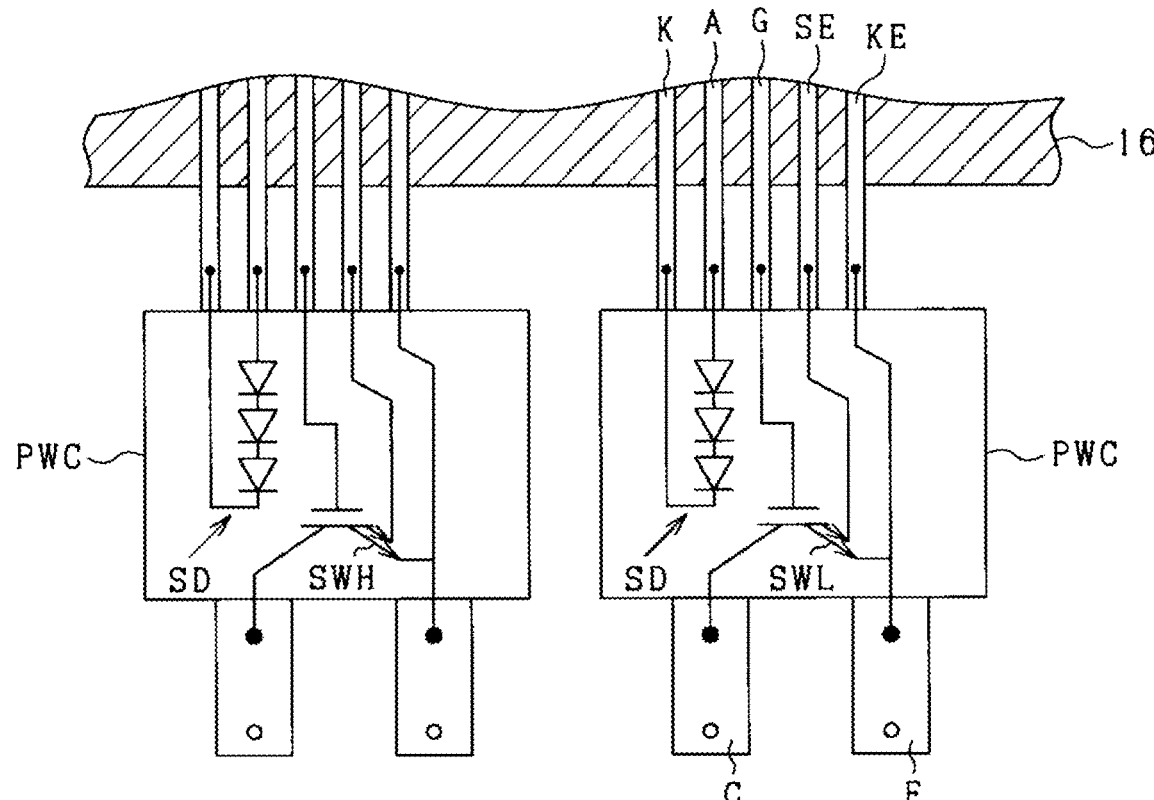
FIG. 3 is a schematic diagram illustrating a configuration of each power card.

As illustrated in FIG. 3, the switches SWH, SWL of the inverter 15 are mounted on a second surface opposite from the first surface of the circuit board 16. The switch SWH, its associated diode DH, and a temperature sensitive diode SD, for each phase, are housed together in a body made of insulating material to form a module. The switch SWL, its associated diode DL, and a temperature sensitive diode SD, for each phase, are housed together in a body made of insulating material to form a module. In FIG. 3, the diodes DH, DL are not shown.

A power card PWC that is a modularized electronic component housing the upper arm switch SWH has basically the same structure as a power card PWC housing the lower arm switch SWL. Each power card PWC includes a plurality of signal terminals protruding externally from the body.

Specifically, the gate terminal G of the switch SWH/SWL, an emitter detection terminal KE, and a sense terminal SE, and the anode A and cathode K of the temperature sensitive diode SD, are connected to the circuit board 16. Here, the emitter detection terminal KE is connected to the emitter E of the switch SWH/SWL and is an electrode at the same voltage as the emitter E. A collector detection terminal KC is connected to the collector of the switch SWH/SWL and is an electrode at the same voltage as the collector C. The sense terminal SE is a terminal for outputting a small current that is positively correlated with the current flowing through the switch SWH/SWL. The switch SWH/SWL means any of the switch SWH and the switch SWL.

For each phase, the upper arm driver 52a is connected to the gate terminal G and emitter detection terminal KE of the upper arm switch SWH. For each phase, the lower arm driver 52b is connected to the gate terminal G and emitter detection terminals KE of the lower arm switch SWL. The upper arm and lower arm drivers 52a, 52b drive the upper arm and lower arm switches SWH, SWL by applying voltages to the gate terminals G of the upper arm and lower arm switches SWH, SWL.

For each phase, the upper arm driver 52a is connected to the sense terminal SE of the upper arm switch SWH and to the anode A and cathode K of the temperature sensitive diode SD. For each phase, the lower arm driver 52b is connected to the sense terminal SE of the lower arm switch SWL and to the anode A and cathode K of the temperature sensitive diode SD. The upper arm driver 52a detects a current flowing through the upper arm switch SWH based on an amount of voltage drop across the sense resistor connected to the sense terminal SE. The upper arm driver 52a also detects a temperature of the upper arm switch SWH based on a detected voltage between the anode A and cathode K of the temperature sensitive diode SD. The lower arm driver 52b detects a current flowing through the lower arm switch SWL based on an amount of voltage drop across the sense resistor connected to the sense terminal SE. The lower arm driver 52b also detects a temperature of the lower arm switch SWL based on a detected voltage between the anode A and cathode K of the temperature sensitive diode SD.

Figure 4:
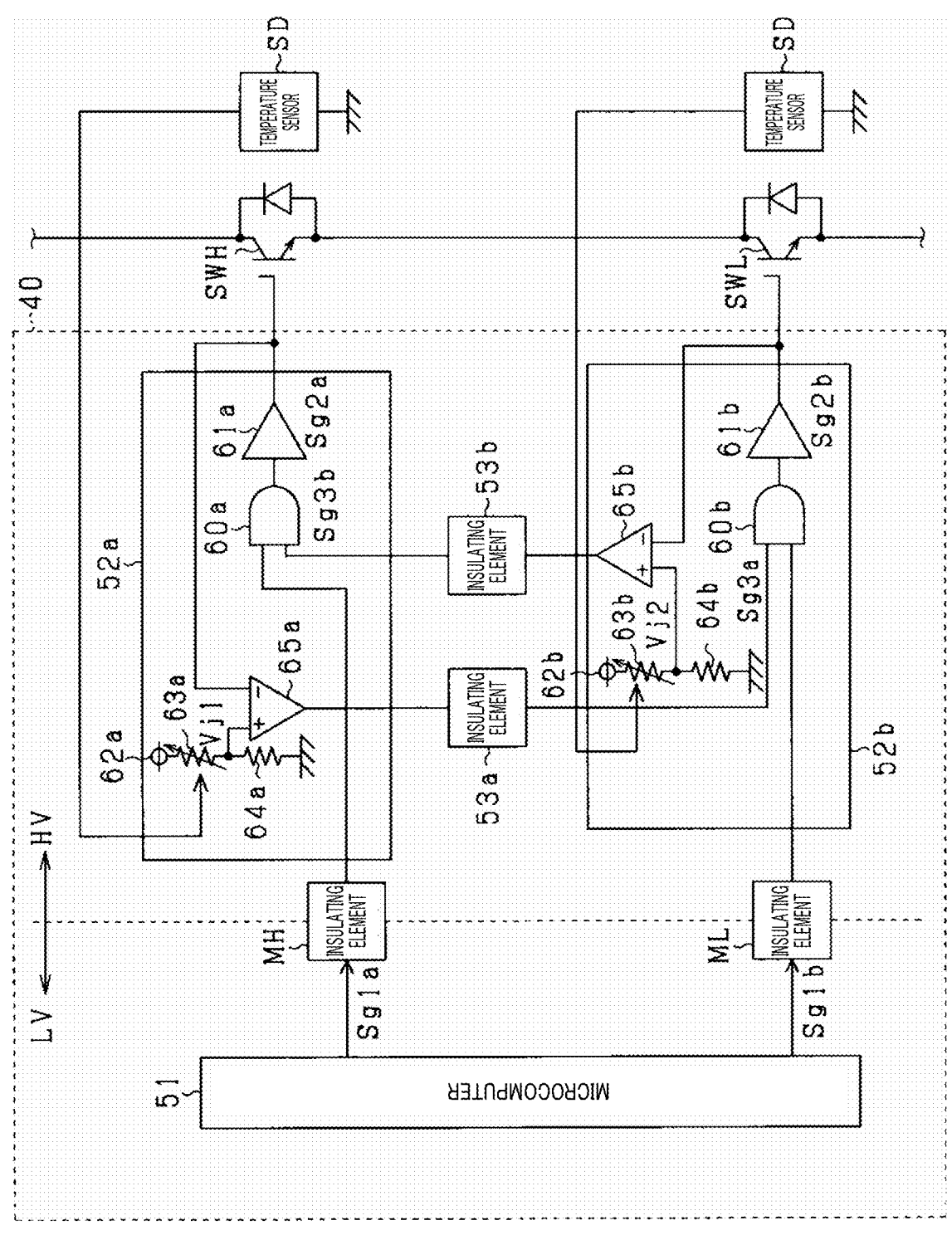
FIG. 4 is a schematic diagram illustrating a configuration of a control device.

The configuration of the control device 40 will now be described using FIG. 4.

The control device 40 includes the microcomputer 51, the upper arm and lower arm drivers 52a, 52b, and the upper arm and lower arm insulating elements MH, ML.

The microcomputer 51 includes a central processing unit (CPU). The microcomputer 51 generates upper arm and lower arm switching commands Sg1a, Sg1b for the upper arm and lower arm drivers 52a, 52b to control a controlled variable of the rotating electric machine 10 to its command value. The controlled variable may be, for example, a torque. In the present embodiment, the upper arm and lower arm switching commands Sg1a, Sg1b indicate an ON command for the upper arm and lower arm switches SWH, SWL by a logic H, i.e., a logic high level and an OFF command for the upper arm and lower arm switches SWH, SWL by a logic L, i.e., a logic low level. In the present embodiment, the microcomputer 51 corresponds to a command generator.

The upper arm switching command Sg1a output from the microcomputer 51 is input to the upper arm driver 52a via the upper arm insulating element MH. The lower arm switching command Sg1b output from the microcomputer 51 is input to the lower arm driver 52b via the lower arm insulating element ML. The insulating element MH transfers the upper arm switching command Sg1a to the upper arm driver 52a while insulating the microcomputer 51 from the upper arm driver 52a. The insulating element ML transfers the lower arm switching command Sg1b to the lower arm driver 52b while insulating the microcomputer 51 from the lower arm driver 52b.

The upper arm driver 52a is configured to drive the upper arm switch SWH and outputs the upper arm drive signal Sg2a based on the input upper arm switching command Sg1a. The lower arm driver 52b is configured to drive the lower arm switch SWL and outputs the lower arm drive signal Sg2b based on the input lower arm switching command Sg1b.

The upper arm drive signal Sg2a is input to the gate of the upper arm switch SWH, and the lower arm drive signal Sg2b is input to the gate of the lower arm switch SWL. In the present embodiment, each of the drive signals Sg2a, Sg2b indicates that the switch to be driven is to be turned on by the logic H and that the switch to be driven is to be turned off by the logic L.

The upper arm driver 52a includes a first AND circuit 60a and a first buffer circuit 61a. The upper arm switching command Sg1a received via the upper arm insulating element MH and the lower arm transferred signal Sg3b described later are input to the first AND circuit 60a. When the logic level of the upper arm switching command Sg1a is the logic H and the logic level of the lower arm transferred signal Sg3b is the logic H, the first AND circuit 60a outputs the upper arm drive signal Sg2a of the logic H. The upper arm drive signal Sg2a of the logic H causes the gate voltage of the upper arm switch SWH to be set to the threshold voltage Vth or higher. This causes the upper arm switch SWH to be turned on.

On the other hand, the first AND circuit 60a outputs the upper arm drive signal Sg2a of the logic L when at least one of the upper arm switching command Sg1a and the lower arm transferred signal Sg3b is the logic L. The upper arm drive signal Sg2a of the logic L causes the gate voltage of the upper arm switch SWH to be lower than the threshold voltage Vth. This causes the upper arm switch SWH to be turned off.

The lower arm driver 52b includes a second AND circuit 60b and a second buffer circuit 61b. The lower arm switching command Sg1b received via the lower arm insulating element ML and the upper arm transferred signal Sg3a described later are input to the second AND circuit 60b. The second AND circuit 60b outputs the lower arm drive signal Sg2b of the logic H when the logic level of the lower arm switching command Sg1b is the logic H and the logic level of the upper arm transferred signal Sg3a is the logic H. The lower arm drive signal Sg2b of the logic H causes the gate voltage of the lower arm switch SWL to be set to the threshold voltage Vth or higher. This causes the lower arm switch SWL to be turned on.

On the other hand, the second AND circuit 60b outputs the lower arm drive signal Sg2b of the logic L when at least one of the lower arm switching command Sg1b and the upper arm transferred signal Sg3a is the logic L. The lower arm drive signal Sg2b of the logic L causes the gate voltage of the lower arm switch SWL to be lower than the threshold voltage Vth. This causes the lower arm switch SWL to be turned off.

The upper arm driver 52a includes a first constant voltage source 62a, a first variable resistor 63a, a first determination resistor 64a, and a first operational amplifier 65a. The first constant voltage source 62a is connected to a first end of the first variable resistor 63a. A second end of the first variable resistor 63a is connected to a first end of the first determination resistor 64a and the non-inverting input terminal of the first operational amplifier 65a. A second end of the first determination resistor 64a is connected to the emitter detection terminal KE of the upper arm switch SWH. The inverting input terminal of the first operational amplifier 65a is connected to the gate of the upper arm switch SWH, and the output terminal of the first operational amplifier 65a is connected to the first transfer element 53a of the control device 40. In the present embodiment, the first transfer element 53a may be a magnetic coupler or a photocoupler. For example, the first transfer element 53a may be provided inside the upper arm driver 52a or the lower arm driver 52b.

The output voltage of the first constant voltage source 62a is divided by the first variable resistor 63a and the first determination resistor 64a. A first determination voltage Vj1, which is the voltage divided, is input to the non-inverting input terminal of the first operational amplifier 65a. The gate voltage of the upper arm switch SWH is input to the inverting input terminal of the first operational amplifier 65a.

The first determination voltage Vj1 to be input to the non-inverting input terminal of the first operational amplifier 65a is set based on the output voltage of the first constant voltage source 62a, the resistance of the first variable resistor 63a, and the resistance of the first determination resistor 64a, in order to be able to determine whether the gate voltage of the upper arm switch SWH is higher than the threshold voltage Vth. When the voltage input to the inverting input terminal is higher than the voltage input to the non-inverting input terminal, the first operational amplifier 65a outputs the upper arm transferred signal Sg3a of the logic L. On the other hand, when the voltage input to the inverting input terminal is lower than the voltage input to the non-inverting input terminal, the first operational amplifier 65a outputs the upper arm transferred signal Sg3a of the logic H.

The upper arm transferred signal Sg3a output from the first operational amplifier 65a is input to the second AND circuit 60b via the first transfer element 53a. The upper arm transferred signal Sg3a is a signal that notifies the lower arm driver 52b that the upper arm switch SWH is off (or has been turned off) by the logic H and notifies the lower arm driver 52b that the upper arm switch SWH is on (or has been turned on) by logic L.

The lower arm driver 52b includes a second constant voltage source 62b, a second variable resistor 63b, a second determination resistor 64b, and a second operational amplifier 65b. The second constant voltage source 62b is connected to a first end of the second variable resistor 63b. A second end of the second variable resistor 63b is connected to a first end of the second determination resistor 64b and a non-inverting input terminal of the second operational amplifier 65b. A second end of the second determination resistor 64b is connected to the emitter detection terminal KE of the lower arm switch SWL. The inverting input terminal of the second operational amplifier 65b is connected to the gate of the lower arm switch SWL, and the output terminal of the second operational amplifier 65b is connected to the second transfer element 53b of the control device 40. In the present embodiment, the second transfer element 53b may be a magnetic coupler or a photocoupler. For example, the second transfer element 53b may be provided inside the upper arm driver 52a or the lower arm driver 52b.

The output voltage of the second constant voltage source 62b is divided by the second variable resistor 63b and the second determination resistor 64b. The second determination voltage Vj2, which is the voltage divided, is input to the non-inverting input terminal of the second operational amplifier 65b. The gate voltage of the lower arm switch SWL is input to the inverting input terminal of the second operational amplifier 65b.

The second determination voltage Vj2 to be input to the non-inverting input terminal of the second operational amplifier 65b is set based on the output voltage of the second constant voltage source 62b, the resistance of the second variable resistor 63b, and the resistance of the second determination resistor 64b, in order to be able to determine whether the gate voltage of the lower arm switch SWL is higher than the threshold voltage Vth. The second operational amplifier 65b outputs the lower arm transferred signal Sg3b of the logic L when the voltage input to the inverting input terminal is higher than or equal to the voltage input to the non-inverting input terminal. On the other hand, the second operational amplifier 65b outputs a lower arm transferred signal Sg3b of the logic H when the voltage input to the inverting input terminal is lower than the voltage input to the non-inverting input terminal.

The lower arm transferred signal Sg3b output from the second operational amplifier 65b is input to the first AND circuit 60a via the second transfer element 53b. The lower arm transferred signal Sg3b is a signal that notifies the upper arm driver 52a that the lower arm switch SWL is off (has been turned off) by the logic H and notifies the upper arm driver 52a that the lower arm switch SWL is on (has been turned on) by the logic L.

Here, the threshold voltage Vth of each of the switches SWH, SWL may vary depending on the temperature of the switch. Specifically, for each of the switches SWH, SWL, the lower the temperature of the switch, the higher the threshold voltage Vth of the switch. As a result, each of determination voltages Vj1, Vj2 may deviate from the threshold voltage Vth. For example, if each of the determination voltages Vj1, Vj2 exceeds the threshold voltage Vth, a short circuit between the upper and lower arms may occur, in which both of the switches SWH, SWL are on. Thus, there is concern that the reliability of each of the switches SWH, SWL may decrease. In addition, for example, if each of the determination voltages Vj1, Vj2 falls below the threshold voltage Vth, the dead time, which is a time period during which both of the switches SWH, SWL are off, increases. Thus, there is concern that losses caused by switching of the switches SWH, SWL may increase.

Therefore, the configuration is designed such that, for each of the switches SWH, SWL, a determination condition for determining whether the switch is on or off is variably set according to the characteristics of the switch. In the present embodiment, for each of the switches SWH, SWL, the lower the temperature of the switch, the higher each determination voltage is set to be.

The upper arm driver 52a acquires a detection value from the temperature sensitive diode SD in the power card PWC of the upper arm switch SWH. The upper arm driver 52a variably sets the first determination voltage Vj1 by changing the resistance of the first variable resistor 63a based on the acquired detection value. The lower arm driver 52b also acquires a detection value from the temperature sensitive diode SD in the power card PWC of the lower arm switch SWL. The lower arm driver 52b variably sets the second determination voltage Vj2 by changing the resistance of the second variable resistor 63b based on the acquired detection value. In the present embodiment, a combination of the drivers 52a and 52b corresponds to a temperature acquirer.

Figure 5:
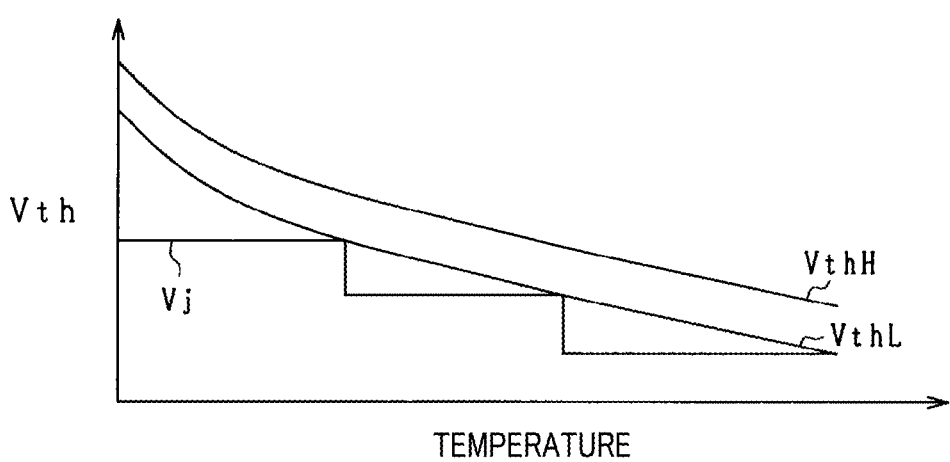
FIG. 5 is an illustration of a method of setting a determination voltage.

Specifically, as illustrated in FIG. 5, the threshold voltage Vth of each of the switches SWH, SWL decreases as the temperature of the switch increases. The threshold voltage Vth and temperature characteristics of each of the switches SWH, SWL differ according to the individual characteristics of the switch, and have a predefined variation range. In FIG. 5, the upper limit of the variation range of the threshold voltage Vth is indicated by VthH and the lower limit by VthL.

For each of the switches SWH, SWL, the higher the temperature of the switch, the lower the determination voltage Vj for that switch is set to be. In the present embodiment, the determination voltage Vj is set lower than or equal to the lower limit VthL of a variation range of the threshold voltage. This can prevent one of the switches SWH, SWL, to be turned off, from being determined to be off despite the fact that this one of the switches SWH, SWL has not been actually turned off. Therefore, occurrence of a short circuit between the upper and lower arms can be prevented. In addition, for each of the switches SWH, SWL, the lower the temperature of the switch, the higher the determination voltage Vj for that switch is set to be, which can suppress an increase in the dead time.

In the present embodiment, the first determination voltage Vj1 is set by changing the resistance of the first variable resistor 63a. The higher the detection value of the temperature sensitive diode SD in the power card PWC of the upper arm switch SWH, the higher the resistance of the first variable resistor 63a is set to be. As a result, the first determination voltage Vj1 is set lower.

The second determination voltage Vj2 is set by changing the resistance of the second variable resistor 63b. The higher the detection value of the temperature sensitive diode SD in the power card PWC of the lower arm switch SWL, the higher the resistance of the second variable resistor 63b is set to be. As a result, the second determination voltage Vj2 is set lower. In the present embodiment, a combination of the drivers 52a, 52b corresponds to a determiner.

Each variable resistor 63a, 63b may include a plurality of resistors of different resistance values. The resistance of the variable resistor 63a is changed by switching the resistors connected to the constant voltage source 62a and the determination resistor 64a. The resistance of the variable resistor 63b is changed by switching the resistors connected to the constant voltage source 62b and the determination resistor 64b. Therefore, each of the determination voltages Vj1, Vj2 is set lower in a stepwise manner as the temperature of each of the switches SWH, SWL increases. Each of the variable resistors 63a, 63b may have its resistance changed continuously. In this case, the determination voltage Vj1 may be set lower in a continuous manner as the temperature of the switch SWH increases, and the determination voltage Vj2 may be set lower in a continuous manner as the temperature of the switch SWL increases.

Figure 6:
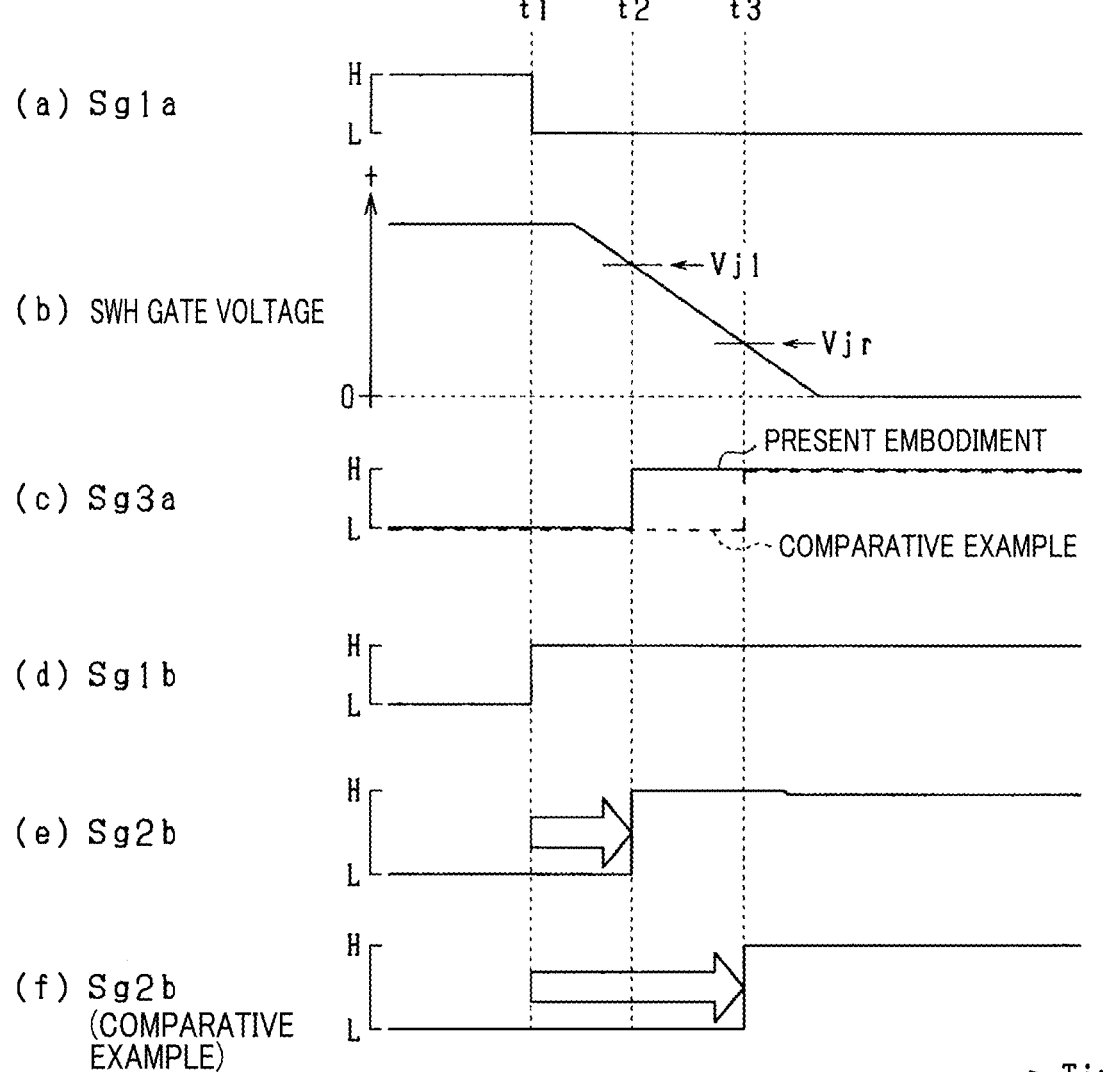
FIG. 6 is a timing diagram illustrating an example of control performed by the control device.
Figure 7:
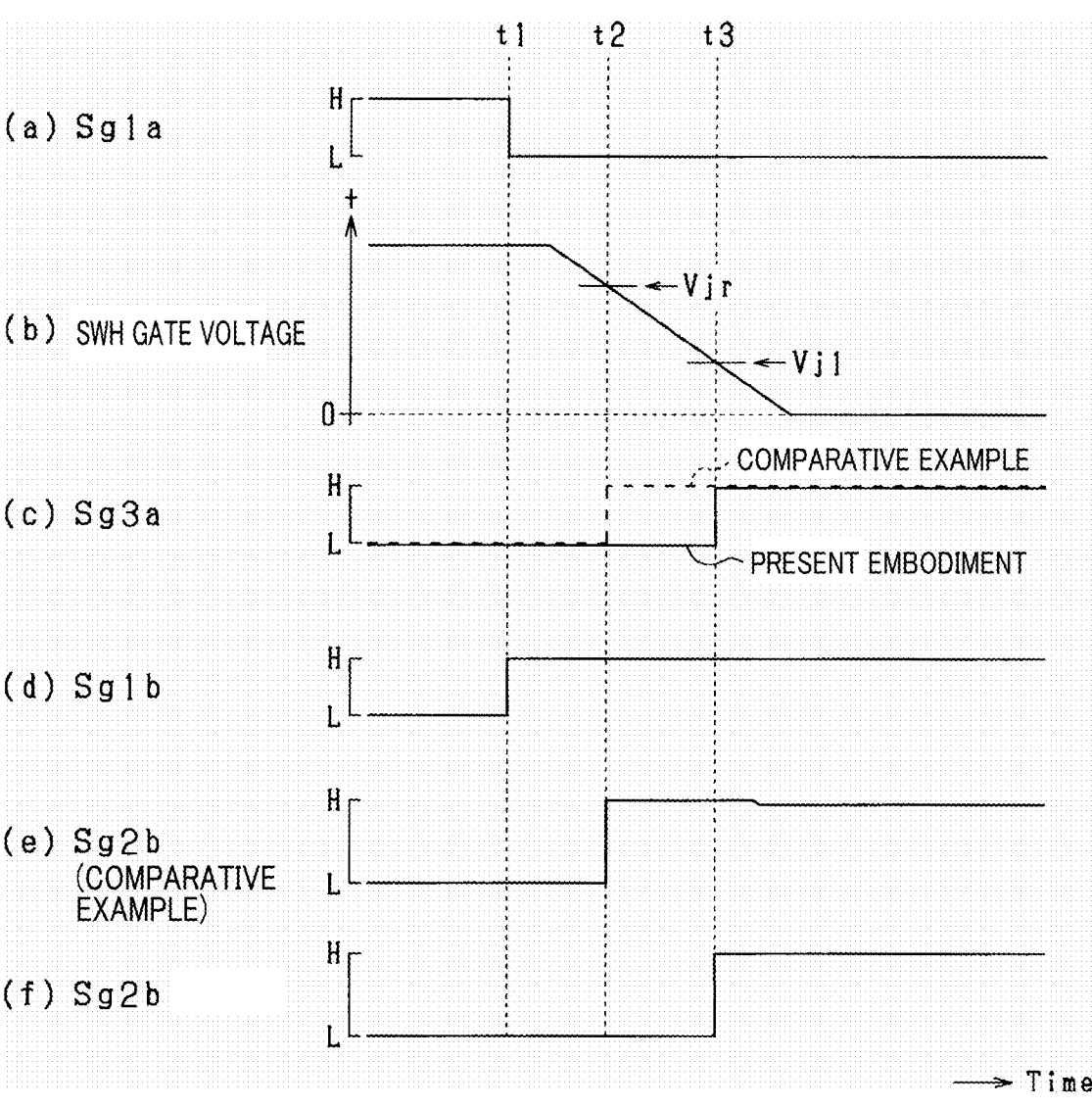
FIG. 7 is a timing diagram illustrating an example of control performed by the control device.

FIGS. 6 and 7 illustrate an example of control when the upper arm switch SWH is turned off and the lower arm switch SWL is turned on. In each of FIGS. 6 and 7, the diagram (a) illustrates a progress of the upper arm switching command Sg1a, the diagram (b) illustrates a progress of the gate voltage of the upper arm switch SWH, the diagram (c) illustrates a progress of the upper arm transferred signal Sg3a, the diagram (d) illustrates a progress of the lower arm switching command Sg1b, the diagram (e) illustrates a progress of the lower arm drive signal Sg2b in the present embodiment, and the diagram (f) illustrates a progress of the lower arm drive signal Sg2b in a comparative example. In the diagram (c) in each of the FIGS. 6 and 7, the solid line represents a progress of the upper arm transferred signal Sg3a in the present embodiment, and the dashed line represents a progress of the upper arm transferred signal Sg3a in the comparative example.

In FIG. 6, it is assumed that the temperature of the upper arm switch SWH is low and the threshold voltage Vth of the upper arm switch SWH varies to be higher than a determination voltage Vjr in the comparative example. The determination voltage Vjr in the comparative example is a fixed value. In this case, the first determination voltage Vj1 is set lower than the lower limit of the variation range of the threshold voltage VthL and higher than the determination voltage Vjr in the comparative example.

At time t1, the logic level of the upper arm switching command Sg1a is switched from H to L. As a result, the gate voltage of the upper arm switch SWH begins to ramp down after time t1. In addition, at time t1, the logic level of the lower arm switching command Sg1b is switched from L to H.

At time t2, the gate voltage of the upper arm switch SWH falls below the first determination voltage Vj1. This causes the logic level of the upper arm transferred signal Sg3a in the present embodiment is switched from L to H. Therefore, the logic level of the lower arm switching command Sg1b is set to H and the logic level of the upper arm transferred signal Sg3a is set to H, so that the logic level of the lower arm drive signal Sg2b is switched from L to H. In this case, the time period from time t1 to time t2 is a waiting period for the lower arm driver 52b.

At time t3, the gate voltage of the upper arm switch SWH falls below the determination voltage Vjr in the comparative example. This causes the logic level of the upper arm transferred signal Sg3a in the comparative example to be switched from L to H. Therefore, the logic level of the lower arm switching command Sg1b is set to H and the logic level of the upper arm transferred signal Sg3a is set to H, so that the logic level of the lower arm drive signal Sg2b is switched from L to H. In this case, the time period from time t1 to time t3 is a waiting period for the lower arm driver 52b.

The waiting period for the lower arm driver 52b in the comparative example is longer than the waiting period for the lower arm driver 52b in the present embodiment. In other words, in the present embodiment, the waiting period for the lower arm driver 52b can be reduced than in the comparative example. Therefore, the dead time can be reduced, and the losses caused by switching of each of the switches SWH, SWL can be reduced. In addition, the first determination voltage Vj1 is set lower than the lower limit VthL of the variation range of the threshold voltage, which can prevent occurrence of a short circuit between the upper and lower arms.

In FIG. 7, it is assumed that the temperature of the upper arm switch SWH is high and the threshold voltage Vth of the upper arm switch SWH varies to be lower than the determination voltage Vjr in the comparative example. The determination voltage Vjr in the comparative example is a fixed value. In this case, the first determination voltage Vj1 is set lower than the lower limit VthL of the variation range of the threshold voltage. In FIG. 7, control until time t1 is the same as in FIG. 6 above.

At time t2, the gate voltage of the upper arm switch SWH falls below the determination voltage Vjr in the comparative example. In this case, despite the fact that the upper arm switch SWH is not actually off, the upper arm switch SWH is determined to be off, and the logic level of the upper arm transferred signal Sg3a in the comparative example is switched on from L to H. As a result, the logic level of the lower arm switching command Sg1b is set to H and the logic level of the upper arm transferred signal Sg3a is set to H, so that the logic level of the lower arm drive signal Sg2b in the comparative example is switched on from L to H. In this case, a short-circuit between the upper and lower arms may occur during the time period from time t2 to when the gate voltage of the upper arm switch SWH falls below the threshold voltage.

In contrast, under control in the present embodiment, the gate voltage of the upper arm switch SWH falls below the first determination voltage Vj1 at time t3. In this case, the upper arm switch SWH is determined to be off while the upper arm switch SWH is actually off, and the logic level of the upper arm transferred signal Sg3a in the present embodiment is switched on from L to H. Therefore, in the present embodiment, occurrence of a short-circuit between the upper and lower arms can be prevented.

The present embodiment described in detail above can provide the following advantages.

For each of the switches SWH, SWL, the lower the temperature of the switch, the higher the threshold voltage Vth of the switch. In this case, a time period from when the gate voltage of one of the switches SWH, SWL, to be turned off, begins to ramp down to when this gate voltage falls below the threshold voltage Vth is shortened. In this regard, in the present embodiment, the lower the temperature of the switch SWH, the higher the determination voltage Vj1 of the switch SWH is set to be. The lower the temperature of the switch SWL, the higher the determination voltage Vj2 of the switch SWL is set to be. The determination voltage Vj1 is set higher, which allows the waiting period of the driver 52a to be shortened. The determination voltage Vj2 is set higher, which allows the waiting period of the driver 52b to be shortened. As a result, the dead time can be reduced, and the losses caused by the switching of each of the switches SWH, SWL can be reduced.

For each of the switches SWH, SWL, the higher the temperature of the switch, the lower the threshold voltage Vth of the switch. In this case, one of the switches SWH, SWL may be determined to be off despite the fact that this one of the switches SWH, SWL has not been actually turned off. Thus, a short circuit between the upper and lower arms may be caused by the other one of the switches SWH, SWL being turned on. In this regard, in the present embodiment, the higher the temperature of the switch SWH, the lower the determination voltage Vj1 is set so that Vj1 is lower than the lower limit VthL of the variation range of the threshold voltage. The higher the temperature of the switch SWL, the lower the determination voltage Vj2 is set so that Vj2 is lower than the lower limit VthL of the variation range of the threshold voltage. This can prevent occurrence of a short circuit between the upper and lower arms and ensure the reliability of each of the switches SWH, SWL.

The transfer elements 53a, 53b provided in the high-voltage region HV transfers each transferred signal Sg3a, Sg3b within the high-voltage region HV. This can reduce the transfer delay of each transferred signal Sg3a, Sg3b compared to the configuration in which the microcomputer 51 provided in the low-voltage region LV determines the ON/OFF of each of the switches SWH, SWL.

Second Embodiment

A second embodiment will now be described with reference to the accompanying drawings, focusing on differences from the first embodiment. In the present embodiment, the temperatures input to the variable resistors 63a, 63b are changed.

Figure 8:
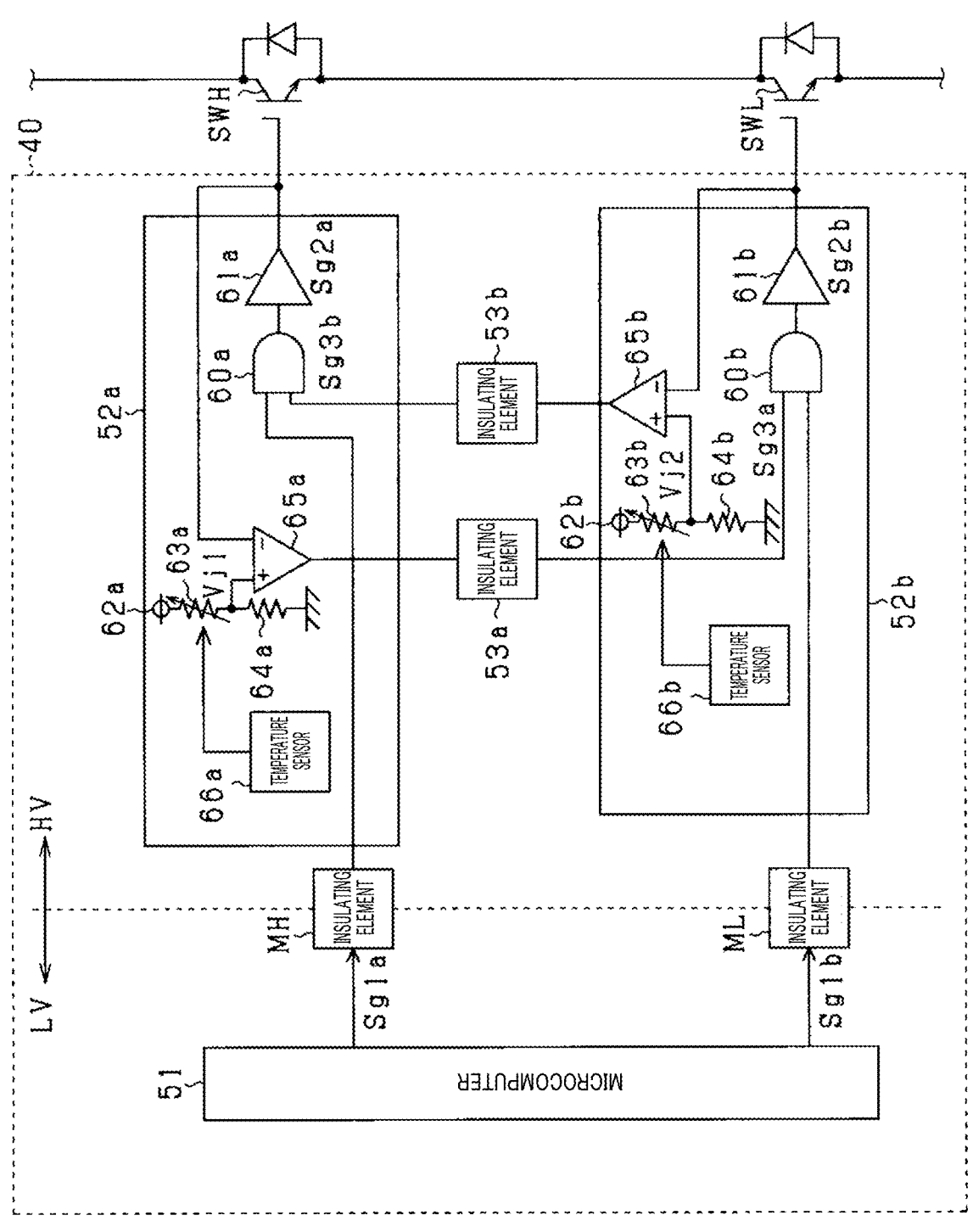
FIG. 8 is a schematic diagram illustrating a configuration of a control device according to a second embodiment.

FIG. 8 illustrates the configuration of the control device 40. In FIG. 8, the same reference numerals are assigned to the same components as in FIG. 4 described earlier and detailed description thereof is omitted for convenience of illustration.

The upper arm driver 52a for each phase includes an upper arm temperature sensor 66a. The upper arm temperature sensor 66a may be, for example, a thermistor, and detects the temperature of the upper arm driver 52a and an area around the upper arm driver 52a. The upper arm driver 52a acquires a detection value of the upper arm temperature sensor 66a. The upper arm driver 52a sets the resistance of the first variable resistor 63a to be higher as the detection value of the upper arm temperature sensor 66a becomes higher. The first determination voltage Vj1 is thereby set lower.

The upper arm driver 52a may estimate the temperature of the upper arm switch SWH based on the detection value of the upper arm temperature sensor 66a. The upper arm driver 52a may set the resistance of the first variable resistor 63a to be higher as the estimated temperature becomes higher. This allows a temperature close to the actual temperature of the upper arm switch SWH to be used for setting the first determination voltage Vj1, which allows the first determination voltage Vj1 to be set appropriately.

The lower arm driver 52b for each phase includes a lower arm temperature sensor 66b. The lower arm temperature sensor 66b may be, for example, a thermistor and detects the temperature of the lower arm driver 52b and an area around the lower arm driver 52b. The lower arm driver 52b acquires a detection value of the lower arm temperature sensor 66b. The lower arm driver 52b sets the resistance of the second variable resistor 63b to be higher as the detection value of the lower arm temperature sensor 66b becomes higher. The second determination voltage Vj2 is thereby set lower.

The lower arm driver 52b may estimate the temperature of the lower arm switch SWL based on the detection value of the lower arm temperature sensor 66b. The lower arm driver 52b may set the resistance of the second variable resistor 63b to be higher as the estimated temperature becomes higher. This allows a temperature close to the actual temperature of the lower arm switch SWL to be used for setting the second determination voltage Vj2, which allows the second determination voltage Vj2 to be set appropriately.

According to the present embodiment, each of the determination voltages Vj1, Vj2 can be variably set using the detection values of the temperature sensors 66a, 66b, even when there is no temperature sensitive diode SD in the power card PWC for each of the switches SWH, SWL.

Third Embodiment

A third embodiment will now be described with reference to the accompanying drawings, focusing on differences from the first embodiment. In the present embodiment, the temperatures input to the drivers 52a, 52b are changed.

Figure 9:
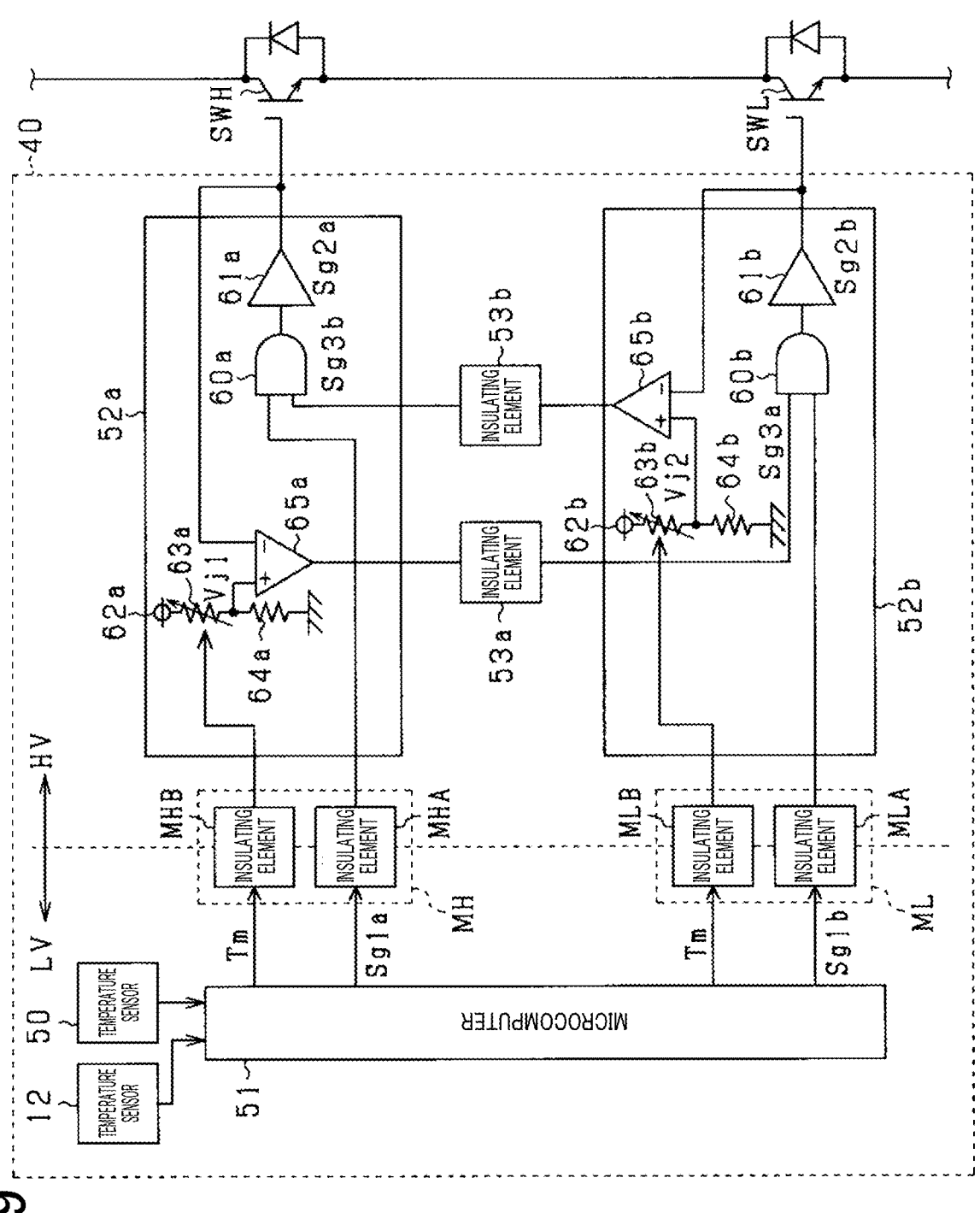
FIG. 9 is a schematic diagram illustrating a configuration of a control device according to a third embodiment.

FIG. 9 illustrates the configuration of the control device 40. In FIG. 9, the same reference numerals are assigned to the same components as in FIG. 4 described earlier and detailed description thereof is omitted for convenience of illustration.

The upper arm insulating element MH includes upper arm first and second elements MHA, MHB, and the lower arm insulating element ML includes lower arm first and second elements MLA, MLB. The microcomputer 51 outputs upper arm and lower arm switching commands Sg1a, Sg1b to the upper arm and lower arm drivers 52a, 52b via the upper arm and lower arm first elements MHA, MLA.

The microcomputer 51 acquires the detection value of the motor temperature sensor 12 and the detection value of the inverter temperature sensor 50. The microcomputer 51 calculates a determination temperature Tm based on at least one of the detection value of the motor temperature sensor 12 and the detection value of the inverter temperature sensor 50.

The microcomputer 51 outputs the determination temperature Tm to the upper arm and lower arm drivers 52a, 52b via the upper arm and lower arm second elements MHB, MLB. The upper arm driver 52a sets the resistance of the variable resistor 63a to be higher as the determination temperature Tm input becomes higher. The lower arm drivers 52b sets the resistance of the variable resistor 63b to be higher as the determination temperature Tm input becomes higher. As a result, each of the determination voltages Vj1, Vj2 is set lower.

For example, the determination temperature Tm may be the average of the detection values of the motor temperature sensor 12 and the inverter temperature sensor 50, or the higher of the detection values of the motor temperature sensor 12 and the inverter temperature sensor 50.

Alternatively, for example, the determination temperature Tm may be the estimated temperature of each of the switches SWH, SWL. Specifically, the microcomputer 51 may estimate the temperature of each of the switches SWH, SWL based on at least one of the detection value of the motor temperature sensor 12 and the detection value of the inverter temperature sensor 50, and set the determination temperature Tm to the estimated temperature. This allows the determination voltages Vj1, Vj2 to be set appropriately since the determination voltage Vj1 is set using the temperature close to the actual temperature of the switch SWH and the determination voltage Vj2 is set using the temperature close to the actual temperature of the switch SWL. In the present embodiment, the microcomputer 51 corresponds to a temperature acquirer.

Fourth Embodiment

A fourth embodiment will now be described with reference to the accompanying drawings, focusing on differences from the first embodiment. In the present embodiment, instead of the driver 52a determining whether the switch SWH is on or off and the driver 52b determining whether the switch SWL is on or off, the microcomputer 51 determines, for each of the switches SWH, SWL, whether the switch is on or off.

Figure 10:
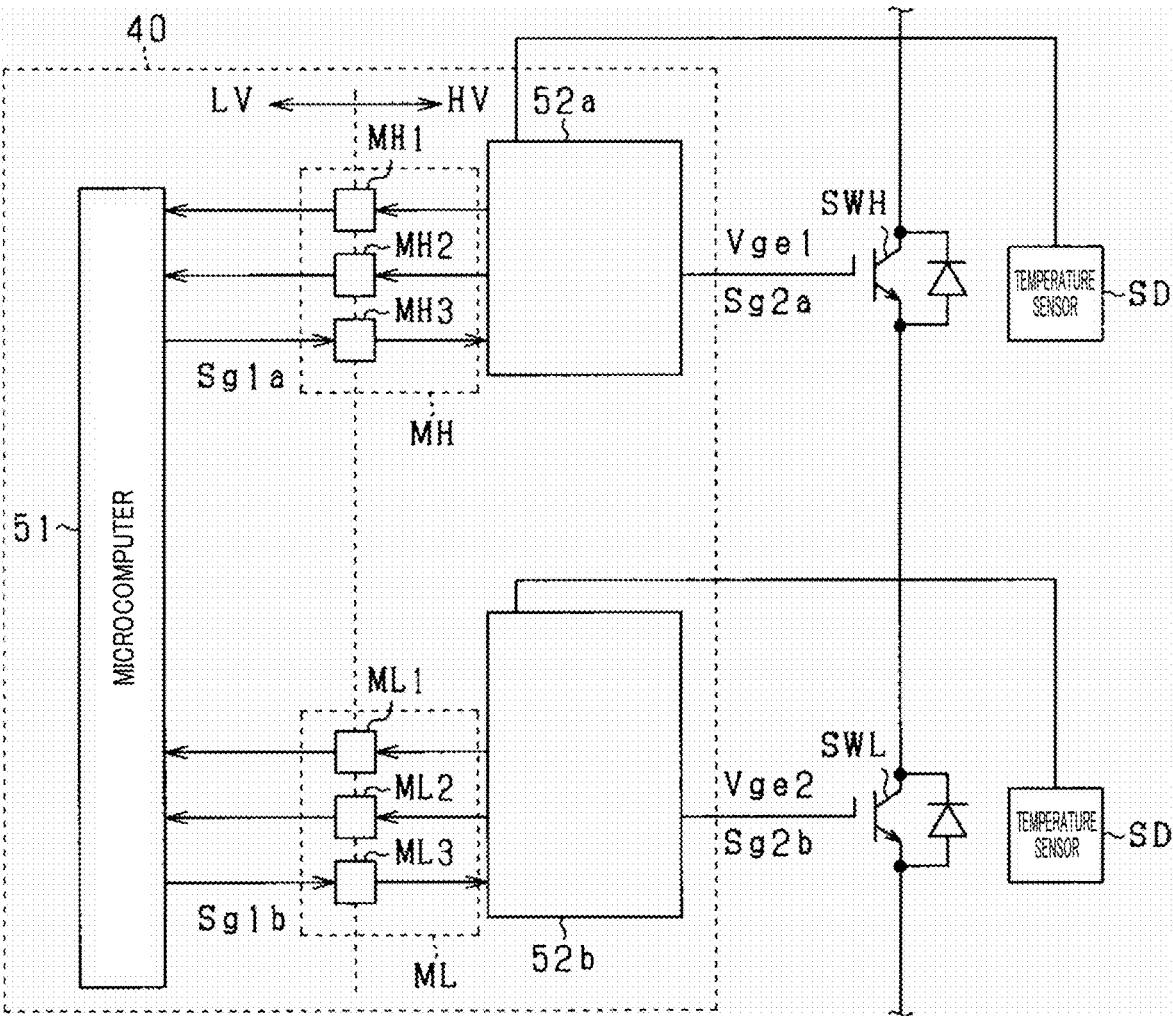
FIG. 10 is a schematic diagram illustrating a configuration of a control device according to a fourth embodiment.

FIG. 10 illustrates the configuration of the control device 40. In FIG. 10, the same reference numerals are assigned to the same components as in FIG. 4 described earlier and detailed description thereof is omitted for convenience of illustration.

The upper arm insulating element MH includes upper arm first to third elements MH1 to MH3, and the lower arm insulating element ML includes lower arm first to third elements ML1 to ML3. The microcomputer 51 acquires temperature information from the temperature sensitive diode SD in the power card PWC of the upper arm switch SWH via the upper arm driver 52a and the upper arm first element MH1. The microcomputer 51 acquires temperature information from the temperature sensitive diode SD in the power card PWC of the lower arm switch SWL via the lower arm driver 52*b* and the lower arm first element ML1. The microcontroller 51 acquires the detection value of each temperature-sensitive diode SD as the determination temperature.

When the upper arm driver 52*a* determines that an abnormality has occurred in the upper arm switch SWH, the upper arm driver 52*a* outputs an upper arm fail signal indicating that an abnormality has occurred. The upper arm fail signal is input to the microcomputer 51 via the upper arm second element MH2. When the lower arm driver 52*b* determines that an abnormality has occurred in the lower arm switch SWL, the lower arm driver 52*b* outputs a lower arm fail signal indicating that an abnormality has occurred. The lower arm fail signal is input to the microcomputer 51 via the lower arm second element ML2. The abnormality in the switch may be, for example, an overcurrent, overheat, or overvoltage condition.

When no upper arm fail signal is output from the upper arm driver 52*a*, the microcomputer 51 acquires the gate voltage Vge1 of the upper arm switch SWH via the upper arm driver 52*a* and the upper arm second element MH2. When no lower arm fail signal is output from the lower arm driver 52*b*, the microcomputer 51 acquires the gate voltage Vge2 of the lower arm switch SWL via the lower arm driver 52*b* and the lower arm second element ML2.

The microcomputer 51 outputs the upper arm switching command Sg1*a* to the upper arm driver 52*a* via the upper arm third element MH3, and outputs the lower arm switching command Sg1*b* to the lower arm driver 52*b* via the lower arm third element ML3. When the logic level of each of the switching commands Sg1*a*, Sg1*b* input is H, the driver 52*a* outputs the drive signal Sg2*a* of the logic H to the gate of the switch SWH, and the driver 52*b* outputs the drive signal Sg2*b* of the logic H to the gate of the switch SWL. Each of the switches SWH, SWL is thereby turned on. When the logic level of each of the switching commands Sg1*a*, Sg1*b* input is L, the driver 52*a* outputs the drive signal Sg2*a* of the logic L to the gate of the switch SWH, and the driver 52*b* outputs the drive signal Sg2*b* of the logic L to the gate of the switch SWL. Each of the switches SWH, SWL is thereby turned off.

Figure 11:
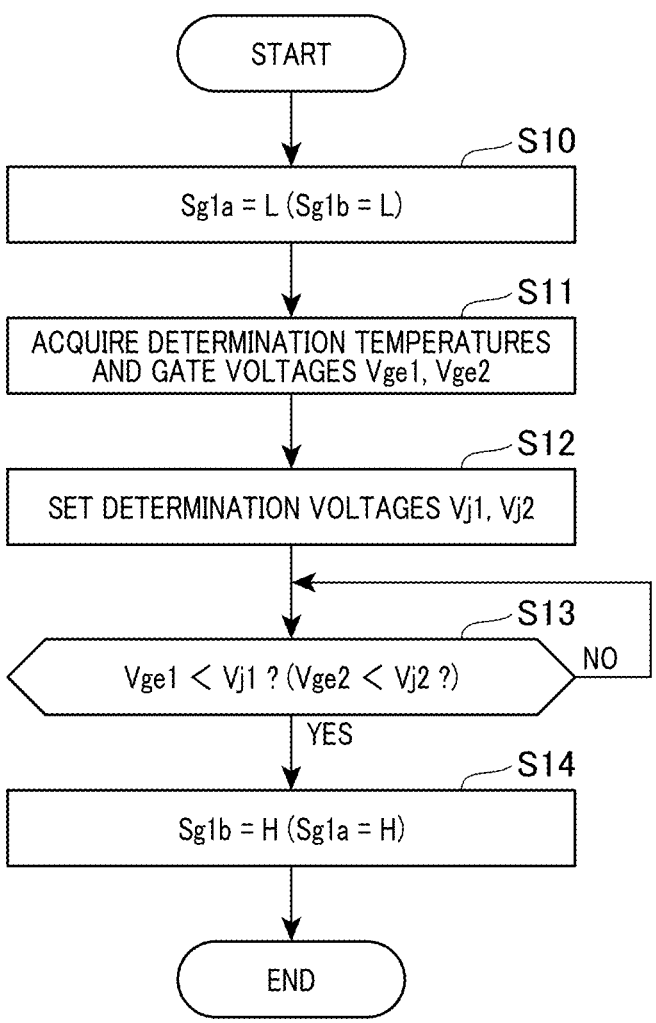
FIG. 11 is a flowchart illustrating process procedures of control performed by a microcomputer.

FIG. 11 illustrates process steps of control performed by the microcomputer 51 will now be described. This control is repeatedly performed by the microcomputer 51 at predefined time intervals.

At step S10, the microcomputer 51 sets the logic level of the upper arm switching command Sg1*a* to L. The logic level of the upper arm drive signal Sg2*a* output from the upper arm driver 52*a* is thereby set to L.

At step S11, the microcomputer 51 acquires the determination temperatures and the gate voltages Vge1, Vge2 of the switches SWH, SWL. The detection value of the temperature sensitive diode SD in the power card PWC of each of the switches SWH, SWL may be acquired as the determination temperature. The gate voltage Vge1 may be acquired via the driver 52*a* and the second element MH2, and the gate voltage Vge2 may be acquired via the driver 52*b* and the second element ML2. In the present embodiment, step S11 corresponds to a temperature acquirer and a voltage acquirer.

At step S12, the microcomputer 51 sets the determination voltages Vj1, Vj2 based on the acquired determination temperatures. Specifically, the microcomputer 51 calculates the temperature of the upper arm switch SWH from the acquired determination temperature, and sets the first determination voltage Vj1 to be higher as the calculated temperature of the upper arm switch SWH becomes lower. The microcomputer 51 also calculates the temperature of the lower arm switch SWL from the acquired determination temperature, and sets the second determination voltage Vj2 to be higher as the calculated temperature of the lower arm switch SWL becomes lower.

At step S13, the microcomputer 51 determines whether the acquired gate voltage Vge1 of the upper arm switch SWH is lower than the first determination voltage Vj1. If the answer is YES at step S13, the microcomputer 51 determines that the upper arm switch SWH is off, and proceeds to step S14. In the present embodiment, steps S12 and S13 correspond to a determiner.

At step S14, the microcomputer 51 sets the logic level of the lower arm switching command Sg1*b* to H. The logic level of the lower arm drive signal Sg2*b* output from the lower arm driver 52*b* is thereby set to H, causing the lower arm switch SWL to be turned on.

In the case where the logic level of the lower arm switching command Sg1*b* is set to L at step S10, the process steps are the same as the process steps illustrated in FIG. 11. In this case, at step S13, the microcomputer 51 determines whether the gate voltage Vge2 of the lower arm switch SWL is lower than the second determination voltage Vj2. At step S14, the microcomputer 51 sets the logic level of the upper arm switching command Sg1*a* to H. The logic level of the upper arm drive signal Sg2*a* output from the upper arm driver 52*a* is set to H, causing the upper arm switch SWH to be turned on.

If the answer is NO at step S13, the microcomputer 51 waits for a predefined time period and then returns to step S13. That is, in the present embodiment, the microcomputer 51 waits until the gate voltage Vge1 of the switch SWH becomes lower than the determination voltage Vj1, and waits until the gate voltage Vge2 of the switch SWL becomes lower than the determination voltage Vj2.

According to the present embodiment, the determination temperatures and the gate voltages Vge1, Vge2 are input to the microcomputer 51 via the insulating elements MH, ML, and the microcomputer 51 determines, for each of the switches SWH, SWL, whether the switch is on or off. The second elements MH2, ML2, which transfer the gate voltages Vge1, Vge2, are also used to transfer the fail signal. Therefore, the number of insulating elements may be reduced as compared to the configuration in which dedicated insulating elements are provided for transferring the gate voltages Vge1, Vge2.

Fifth Embodiment

A fifth embodiment will now de described. Differences from the first embodiment will be mainly described below. In the present embodiment, the method of setting the determination voltage Vj is changed.

When a small current flows through each of the switches SWH, SWL or when the voltage VH between the terminals of the capacitor 23 is low, a momentary short circuit between the upper and lower arms may be allowed. In such a case, the determination voltage Vj is allowed to partially exceed the lower limit VthL of the variation range of the threshold voltage.

Figure 12:
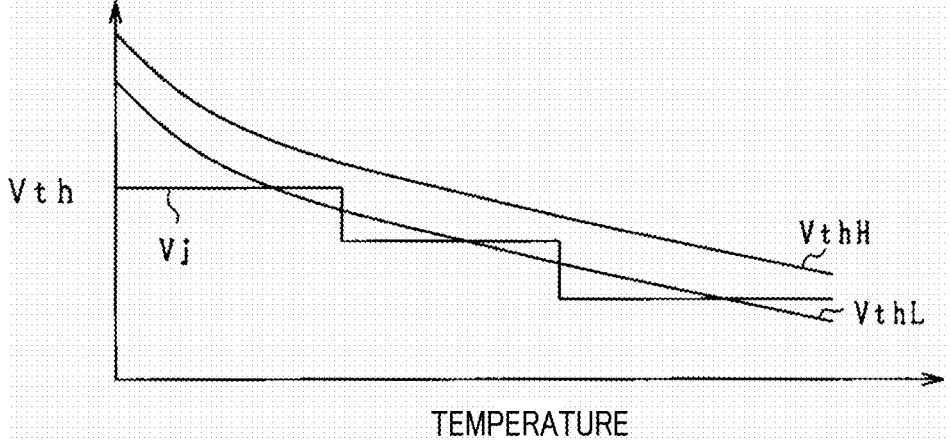
FIG. 12 is an illustration of a method of setting a determination voltage according to a fifth embodiment.

In the present embodiment, instead of the determination voltage Vj being set to be lower than or equal to the lower limit VthL of the variation range of the threshold voltage, the determination voltage Vj may be partially set higher than the lower limit of the variation range of the threshold voltage VthL, as illustrated in FIG. 12.

According to the present embodiment, the determination voltage Vj may be set higher than the lower limit VthL of the variation range of the threshold voltage, within a time period in which a momentary short circuit between the upper and lower arms is allowed. This allows the timing at which each of the switches SWH, SWL is determined to have been turned off to be earlier than in the configuration where the determination voltage Vj is set lower than or equal to the lower limit VthL of the threshold voltage, thereby properly reducing the dead time.

Other Embodiments

The above embodiments may be modified and implemented as follows.

(i) The threshold voltages Vth of the switches SWH, SWL may vary depending on history information of the switches SWH, SWL and individual differences of the switches SWH, SWL. Therefore, in addition to acquiring the temperatures of the switches SWH, SWL, the drivers 52a, 52b may also acquire the history information of the switches SWH, SWL and the individual differences of the switches SWH, SWL. Instead of the temperatures of the switches SWH, SWL, the drivers 52a, 52b may set the determination voltages Vj1, Vj2 based on at least either of the acquired historical information and the individual differences of the switches SWH, SWL. The drivers 52a, 52b may also set the determination voltages Vj1, Vj2 based on at least either of the temperatures, the historical information, and the individual differences of the switches SWH, SWL.

The history information of the switches SWH, SWL may be, for example, at least one of the cumulative duration that the voltage of the DC power source 30 has been applied to each of the switches SWH, SWL and the cumulative number of switching times of each of the switches SWH, SWL. The individual differences of the switches SWH, SWL is information about individually different values due to manufacturing variations of the switches SWH, SWL, that is, electrical or thermal characteristics of the switches SWH, SWL.

(ii) The switches in the switching device section 20 are not limited to IGBTs, but may be, for example, N-channel MOSFETs, each with a built-in body diode.

(iii) The drivers 52a, 52b may acquire collector-emitter currents and collector-emitter voltages of the switches SWH, SWL instead of the gate voltages of the switches SWH, SWL. The drivers 52a, 52b may set the determination voltages Vj1, Vj2 based on the acquired collector-emitter currents and emitter and collector-emitter voltages of the switches SWH, SWL.

Instead of the gate voltages of the switches SWH, SWL, the drivers 52a, 52b may use the collector-emitter currents and collector-emitter voltages of the switches SWH, SWL, time variations of the gate voltages of the switches SWH, SWL, and time variations of the collector-emitter voltages of the switches SWH, SWL, in determining whether each of the switches SWH, SWL is on or off.

(iv) The control device and the method thereof described in the present disclosure may be realized by a dedicated computer provided by configuring a processor and memory programmed to perform one or more functions embodied in a computer program. Alternatively, the control device and the method thereof described in the present disclosure may be realized by a dedicated computer provided by configuring a processor with one or more dedicated hardware logic circuits. Alternatively, the control device and the method thereof described in the present disclosure may be realized by one or more dedicated computers configured by a combination of a processor and memory programmed to perform one or more functions, and a processor configured with one or more hardware logic circuits. In addition, the computer program may be stored in a computer-readable, non-transitory tangible storage medium as instructions to be executed by a computer.

Although the present disclosure has been described in accordance with the above-described embodiments, it is not limited to such embodiments, but also encompasses various variations and variations within equal scope. In addition, various combinations and forms, as well as other combinations and forms, including only one element, more or less, thereof, are also within the scope and idea of the present disclosure.

What is claimed is:

1. A switch driving device for driving an upper arm switch, which is a switch on an upper arm, and a lower arm switch, which is a switch on a lower arm, the upper arm and lower arm switches being electrically connected in series with each other, the switch driving device comprising:
   a temperature acquirer configured to acquire determination temperatures of the upper arm and lower arm switches, which are either temperatures or temperature-correlated values of the upper arm and lower arm switches;
   a voltage acquirer configured to acquire gate voltages of the upper arm and lower arm switches;
   a determiner configured to determine, for each of the upper arm and lower arm switches, whether the switch is on or off; and
   a driver configured to, in response to the determiner determining that one of the upper arm and lower arm switches is off, turn on the other of the upper arm and lower arm switches, wherein
   the determiner is configured to:
      set, for each of the upper arm and lower arm switches, a determination voltage used to determine whether the switch is on or off, to be higher as the determination temperature acquired becomes lower, and
      determine, for each of the upper arm and lower arm switches, that the switch is on when the gate voltage of the switch is higher than or equal to the determination voltage of the switch, and that the switch is off when the gate voltage of the switch is lower than the determination voltage of the switch.

2. The switch driving device according to claim 1, wherein
   the upper arm switch and a temperature sensor that detects a temperature of the upper arm switch constitutes a first module, and the lower arm switch and a temperature sensor that detects a temperature of the lower arm switch constitutes a second module, and
   the temperature acquirer is configured to acquire determination temperatures of the upper arm and lower arm switches, which are the temperatures detected by the temperature sensors in the first and second modules.

3. The switch driving device according to claim 1, wherein
   the determiner and the driver are provided in a high-voltage region,
   the driver comprises:
      an upper arm driver configured to, in response to the determiner determining that the lower arm switch is off, turn on the upper arm switch;

a lower arm driver configured to, in response to the determiner determining that the upper arm switch is off, turn on the lower arm switch;

a first transfer element provided in the high-voltage region, and configured to transfer a signal indicating an on/off state of the upper arm switch to the lower arm driver;

a second transfer element provided in the high-voltage region, and configured to transfer a signal indicating an on/off state of the lower arm switch, to the upper arm driver;

a command generator provided in a low-voltage region that is electrically insulated from the high-voltage region, and configured to generate a switching command for turning on or off a respective one of the upper arm and lower arm switches, and transmit the switching command to each of the upper arm driver and the lower arm driver, wherein the upper arm driver is configured to receive the switching command for turning on the upper arm switch, and upon receiving from the second transfer element the signal indicating the on/off state of the lower arm switch, turn on the upper arm switch, and the lower arm driver is configured to receive the switching command for turning on the lower arm switch, and upon receiving from the first transfer element the signal indicating the on/off state of the upper arm switch, turn on the lower arm switch.

4. A non-transitory computer-readable medium, having stored thereon a program to cause a computer to function as a switch driving device for driving an upper arm switch, which is a switch on an upper arm, and a lower arm switch, which is a switch on a lower arm, the upper arm and lower arm switches being electrically connected in series with each other, the switch driving device comprising:

a temperature acquirer configured to acquire determination temperatures of the upper arm and lower arm switches, which are either temperatures or temperature-correlated values of the upper arm and lower arm switches;

a voltage acquirer configured to acquire gate voltages of the upper arm and lower arm switches;

a determiner configured to determine, for each of the upper arm and lower arm switches, whether the switch is on or off; and a driver configured to, in response to the determiner determining that one of the upper arm and lower arm switches is off, turn on the other of the upper arm and lower arm switches, wherein the determiner is configured to:

set, for each of the upper arm and lower arm switches, a determination voltage used to determine whether the switch is on or off, to be higher as the determination temperature acquired becomes lower, and determine, for each of the upper arm and lower arm switches, that the switch is on when the gate voltage of the switch is higher than or equal to the determination voltage of the switch, and that the switch is off when the gate voltage of the switch is lower than the determination voltage of the switch.

\* \* \* \* \*